(12) United States Patent
Tang et al.

(10) Patent No.: US 11,245,378 B2
(45) Date of Patent: *Feb. 8, 2022

(54) ACOUSTIC WAVE DEVICE WITH SPINEL LAYER AND TEMPERATURE COMPENSATION LAYER

(71) Applicant: Skyworks Solutions, Inc., Irvine, CA (US)

(72) Inventors: Gong Bin Tang, Moriguchi (JP); Rei Goto, Osaka (JP); Hiroyuki Nakamura, Osaka-Fu (JP); Keiichi Maki, Suita (JP)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/923,757

(22) Filed: Jul. 8, 2020

(65) Prior Publication Data

US 2021/0067131 A1     Mar. 4, 2021

Related U.S. Application Data

(63) Continuation of application No. 16/430,078, filed on Jun. 3, 2019, now Pat. No. 10,749,497.

(Continued)

(51) Int. Cl.
*H04B 1/40*     (2015.01)
*H03H 9/02*     (2006.01)
(Continued)

(52) U.S. Cl.
CPC .... *H03H 9/02834* (2013.01); *H03H 9/02559* (2013.01); *H03H 9/14544* (2013.01);
(Continued)

(58) Field of Classification Search
CPC .. H03H 9/02834; H03H 9/25; H03H 9/02559; H03H 9/725; H03H 9/64;
(Continued)

(56) References Cited

U.S. PATENT DOCUMENTS 3,955,160 A    5/1976   Duffy
5,233,259 A    8/1993   Krishnaswamy et al.
(Continued)

FOREIGN PATENT DOCUMENTS

JP        4186300 B2    11/2008
JP       2011-066818 A    3/2011
JP       2017-022501 A    1/2017

OTHER PUBLICATIONS

Geshi et al., "Wafer Bonding of Polycrystalline Spinel with LiNbO3/LiTaO3 for Temperature Compensation of RF Surface Acoustic Wave Devices", SEI Technical Review, No. 75, pp. 116-119, Oct. 2012.

(Continued)

*Primary Examiner* — Nhan T Le
(74) *Attorney, Agent, or Firm* — Knobbe, Martens, Olson & Bear, LLP

(57) ABSTRACT

An acoustic wave device that includes a spinel layer, a piezoelectric layer, a temperature compensating layer between the spinel layer and the piezoelectric layer and an interdigital transducer electrode on the piezoelectric layer is disclosed. The piezoelectric layer is disposed between the interdigital transducer electrode and the spinel layer. The acoustic wave device is configured to generate an acoustic wave having a wavelength of λ. The piezoelectric layer can have a thickness that is less than λ. In some embodiments, the spinel layer can be a polycrystalline spinel layer.

21 Claims, 15 Drawing Sheets

Related U.S. Application Data

(60) Provisional application No. 62/683,333, filed on Jun. 11, 2018, provisional application No. 62/738,245, filed on Sep. 28, 2018.

(51) Int. Cl.
| | | |
|---|---|---|
| *H03H 9/145* | (2006.01) | |
| *H03H 9/64* | (2006.01) | |
| *H03H 9/25* | (2006.01) | |
| *H03H 9/72* | (2006.01) | |
| *H03F 3/24* | (2006.01) | |

(52) U.S. Cl.
CPC ............... *H03H 9/25* (2013.01); *H03H 9/64* (2013.01); *H03H 9/725* (2013.01); *H04B 1/40* (2013.01); *H03F 3/24* (2013.01); *H03F 2200/451* (2013.01)

(58) Field of Classification Search
CPC . H03H 9/14544; H03F 2200/451; H03F 3/24; H04B 1/40
See application file for complete search history.

(56) References Cited

U.S. PATENT DOCUMENTS

| | | | |
|---|---|---|---|
| 6,510,597 B2 | 1/2003 | Yoshida et al. | |
| 6,555,946 B1 * | 4/2003 | Finder | H03H 3/08 |
| | | | 310/324 |
| 7,105,980 B2 | 9/2006 | Abbott et al. | |
| 7,439,649 B2 | 10/2008 | Fujii et al. | |
| 7,510,906 B2 | 3/2009 | Chang et al. | |
| 8,373,329 B2 | 2/2013 | Nakahashi | |
| 8,614,535 B2 | 12/2013 | Tsuji et al. | |
| 9,246,533 B2 | 1/2016 | Fujiwara et al. | |
| 9,276,558 B2 | 3/2016 | Kando et al. | |
| 9,484,886 B2 | 11/2016 | Takemura | |
| 9,520,857 B2 | 12/2016 | Fujiwara et al. | |
| 10,749,497 B2 * | 8/2020 | Tang | H03H 9/25 |
| 10,778,187 B2 * | 9/2020 | Takamine | H03H 9/02574 |
| 2005/0151599 A1 | 7/2005 | Ido et al. | |
| 2006/0243982 A1 | 11/2006 | Chang et al. | |
| 2007/0296304 A1 | 12/2007 | Fujii et al. | |
| 2012/0231218 A1 | 9/2012 | Nakayama et al. | |
| 2018/0109241 A1 * | 4/2018 | Inoue | H03H 9/02574 |
| 2018/0175275 A1 | 6/2018 | Nishihara et al. | |
| 2019/0068161 A1 * | 2/2019 | Kimura | H03H 9/02866 |
| 2019/0123713 A1 | 4/2019 | Daimon | |
| 2019/0260563 A1 | 8/2019 | Yang | |
| 2019/0296713 A1 | 9/2019 | Bhattacharjee | |
| 2019/0379347 A1 | 12/2019 | Goto et al. | |
| 2019/0379348 A1 | 12/2019 | Tang et al. | |
| 2020/0212891 A1 * | 7/2020 | Daimon | H03H 9/14541 |
| 2021/0075389 A1 * | 3/2021 | Belhachemi | H01L 41/313 |

OTHER PUBLICATIONS

Shim et al., "RF MEMS Passives on High-Resistivity Silicon Substrates", IEEE Microwave and Wireless Components Letters, 2013.

* cited by examiner

ACOUSTIC WAVE DEVICE WITH SPINEL LAYER AND TEMPERATURE COMPENSATION LAYER

CROSS REFERENCE TO PRIORITY APPLICATIONS

Any and all applications for which a foreign or domestic priority claim is identified in the Application Data Sheet as filed with the present application are hereby incorporated by reference under 37 CFR § 1.57. This application is a continuation of U.S. patent application Ser. No. 16/430,078, filed Jun. 3, 2019, and titled "ACOUSTIC WAVE DEVICE WITH SPINEL LAYER AND TEMPERATURE COMPENSATION LAYER," which claims the benefit of priority of U.S. Provisional Patent Application No. 62/683,333, filed Jun. 11, 2018 and titled "ACOUSTIC WAVE DEVICE WITH SPINEL LAYER," and also claims the benefit of priority of U.S. Provisional Patent Application No. 62/738,245, filed Sep. 28, 2018 and titled "ACOUSTIC WAVE DEVICE WITH SPINEL LAYER," the disclosures of each of which are hereby incorporated by reference in their entireties herein.

BACKGROUND

Technical Field

Embodiments of this disclosure relate to acoustic wave devices.

Description of Related Technology

Acoustic wave filters can be implemented in radio frequency electronic systems. For instance, filters in a radio frequency front end of a mobile phone can include acoustic wave filters. Two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transducer electrode on a piezoelectric substrate. The surface acoustic wave resonator can generate a surface acoustic wave on a surface of the piezoelectric layer on which the interdigital transducer electrode is disposed.

SUMMARY

The innovations described in the claims each have several aspects, no single one of which is solely responsible for its desirable attributes. Without limiting the scope of the claims, some prominent features of this disclosure will now be briefly described.

In one aspect, an acoustic wave device is disclosed. The acoustic wave device includes a polycrystalline spinel layer and a piezoelectric layer. The piezoelectric layer has a thickness than is less than λ. The acoustic wave device is configured to generate an acoustic wave having a wavelength of λ. The acoustic wave device also includes an interdigital transducer electrode on the piezoelectric layer. The piezoelectric layer is disposed between the interdigital transducer electrode and the polycrystalline spinel layer.

The acoustic wave device can further include a temperature compensating layer disposed between the polycrystalline spinel layer and the piezoelectric layer. The temperature compensating layer can include silicon dioxide. The acoustic wave device can further include a high impedance layer disposed between the temperature compensating layer and the polycrystalline spinel layer, in which the high impedance layer has a higher acoustic impedance than the polycrystalline spinel layer. The temperature compensating layer can be in physical contact with the piezoelectric layer. The temperature compensating layer can be in physical contact with the polycrystalline spinel layer that is opposite to the piezoelectric layer.

The polycrystalline spinel layer can be in physical contact with the piezoelectric layer.

The piezoelectric layer can be a lithium tantalate layer or a lithium niobate layer.

The acoustic wave device can further includes a substrate layer. The polycrystalline spinel layer can be disposed between the substrate layer and the piezoelectric layer. The substrate layer can include one of a silicon layer, an aluminum nitride layer, a diamond layer, a silicon nitride layer, or a silicon carbide layer. The substrate layer can be in physical contact with the polycrystalline spinel layer. The acoustic wave device can further include an adhesive layer attaching the substrate layer and the polycrystalline spinel layer.

In one aspect, a radio frequency module is disclosed. The radio frequency module includes an acoustic wave filter that is configured to filter a radio frequency signal. The acoustic wave filter includes an acoustic wave device that is configured to generate an acoustic wave having a wave length of λ. The acoustic wave device includes a piezoelectric layer having a thickness of less than λ, an interdigital transducer electrode on the piezoelectric layer, and a polycrystalline spinel layer that is arranged such that the piezoelectric layer is disposed between the polycrystalline spinel layer and the interdigital transducer electrode. The radio frequency module also includes a package enclosing the acoustic wave filter.

The radio frequency module can further include a duplexer, in which the duplexer includes the acoustic wave filter and a second acoustic wave filter.

The radio frequency module can further include a radio frequency switch coupled to the acoustic wave filter. The radio frequency switch can be enclosed within the package. The radio frequency module can further include a power amplifier enclosed within the package.

The acoustic wave device can further include a temperature compensating layer that is disposed between the polycrystalline spinel layer and the piezoelectric layer. The acoustic wave can also include a high impedance layer that is disposed between the temperature compensating layer and the polycrystalline spinel layer, in which the high impedance layer has a higher acoustic impedance than the polycrystalline spinel layer.

The acoustic wave device can further include a substrate layer. The polycrystalline spinel layer can be disposed between the substrate layer and the piezoelectric layer.

In one aspect, a wireless communication device is disclosed. The wireless communication device includes an antenna and an acoustic wave filter that is in communication with the antenna. The acoustic wave filter is configured to filter a radio frequency signal. The acoustic wave filter includes an acoustic wave device that is configured to generate an acoustic wave having a wave length of λ. The acoustic wave device includes a piezoelectric layer having a thickness of less than λ, an interdigital transducer electrode on the piezoelectric layer, and a polycrystalline spinel layer arranged such that the piezoelectric layer is disposed between the polycrystalline spinel layer and the interdigital transducer electrode.

The acoustic wave device can further include a temperature compensating layer that is disposed between the polycrystalline spinel layer and the piezoelectric layer. The acoustic wave device can also include a high impedance layer that is disposed between the temperature compensating layer and the polycrystalline spinel layer, in which the high impedance layer has a higher acoustic impedance than the polycrystalline spinel layer.

In one aspect, an acoustic wave device is disclosed. The acoustic wave device includes a piezoelectric layer, a spinel layer and a temperature compensating layer that is disposed between the piezoelectric layer and the spinel layer. The acoustic wave device also includes an interdigital transducer electrode on the piezoelectric layer. The piezoelectric layer is disposed between the temperature compensating layer and the interdigital transducer electrode.

The spinel layer can be a polycrystalline spinel layer. Alternatively, the spinel layer can be a single crystalline spinel layer.

The piezoelectric layer can be a lithium tantalate layer or a lithium niobate layer.

The acoustic wave device is configured to generate an acoustic wave having a wavelength of $\lambda$, and the piezoelectric layer can have a thickness of less than $\lambda$.

The temperature compensating layer can include silicon dioxide. The temperature compensating layer has a first surface and a second surface. The first surface can be in physical contact with the spinel layer. The second surface can be in physical contact with the piezoelectric layer.

The acoustic wave device can further include a substrate layer. The spinel layer can be disposed between the substrate layer and the piezoelectric layer. The substrate layer can include one of a silicon layer, an aluminum nitride layer, a diamond layer, a silicon nitride layer, or a silicon carbide layer.

The acoustic wave device can further include a high impedance layer disposed between the temperature compensating layer and the spinel layer, in which the high impedance layer has a higher acoustic impedance than the polycrystalline spinel layer In one aspect, a radio frequency module is disclosed. The radio frequency module includes an acoustic wave filter that is configured to filter a radio frequency signal. The acoustic wave filter includes an acoustic wave device that includes a piezoelectric layer, a spinel layer, and a temperature compensating layer that is disposed between the piezoelectric layer and the spinel layer. The radio frequency module also includes a package enclosing the acoustic wave filter.

The radio frequency module can further include a duplexer. The duplexer can include the acoustic wave filter and a second acoustic wave filter.

The radio frequency module further can include a radio frequency switch coupled to the acoustic wave filter. The radio frequency switch can be enclosed within the package. The radio frequency module can further include a power amplifier enclosed within the package.

The spinel layer can be a polycrystalline spinel layer. Alternatively, the spinel layer can be a single crystalline spinel layer.

The piezoelectric layer can be a lithium tantalate layer or a lithium niobate layer.

The acoustic wave device is configured to generate an acoustic wave having a wavelength of $\lambda$. The piezoelectric layer can have a thickness of less than $\lambda$.

In one aspect, a wireless communication device is disclosed. The wireless communication device includes an antenna and an acoustic wave filter that is in communication with the antenna. The acoustic wave filter is configured to filter a radio frequency signal. The acoustic wave filter includes an acoustic wave device that includes a piezoelectric layer, a spinel layer, and a temperature compensating layer that is disposed between the piezoelectric layer and the spinel layer.

The wireless communication device can include a duplexer. The duplexer can include the acoustic wave filter and a second acoustic wave filter.

The wireless communication device can further include a radio frequency switch that is coupled to the acoustic wave filter. The radio frequency switch and a power amplifier can be enclosed within the package.

The spinel layer can be a polycrystalline spinel layer. Alternatively, the spinel layer can be a single crystalline spinel layer.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 16/429,900, titled "ACOUSTIC WAVE DEVICE WITH SPINEL LAYER," filed on Jun. 3, 2019, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
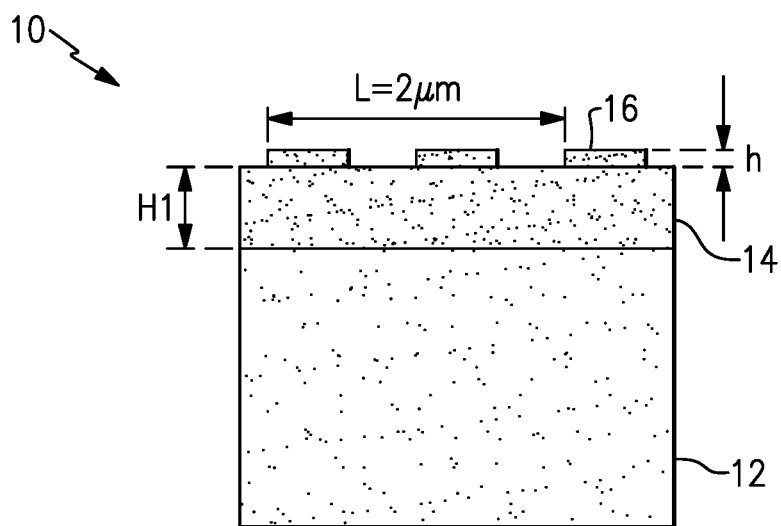
FIG. 1A illustrates a cross section of a baseline surface acoustic wave device.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) devices. The SAW devices can be SAW resonators.

A composite substrate acoustic wave element that includes a lithium tantalate ($LiTaO_3$) layer laminated on a silicon (Si) layer can suppress leakage in the substrate direction and achieve an improved quality factor (Q). In such an acoustic wave device, higher-order modes can occur due to reflected waves generated at the interface between the lithium tantalate and silicon layers. The higher-order modes can deteriorate out-of-band attenuation characteristics. Such higher-order modes can be inhibited from occurring using spinel, which can have the chemical formula of $MgAl_2O_4$, instead of silicon (Si) in accordance with embodiments discussed herein.

Aspects of this disclosure relate to a multi-layer piezoelectric substrate that includes a lithium tantalate layer and a spinel layer, such as a polycrystalline spinel layer. A lithium tantalate layer on a polycrystalline spinel layer can inhibit higher-order modes from occurring in an acoustic wave device.

The propagation acoustic velocity of transverse-wave bulk waves in spinel (e.g., polycrystalline spinel and/or single crystalline spinel) is less than the propagation acoustic velocity of transverse-wave bulk waves in silicon, whereas the propagation acoustic velocity of transverse waves in spinel is greater than those of lithium tantalate. Accordingly, it is possible to lower the cutoff frequency of bulk emission in the substrate direction with a spinel layer without deteriorating the shear horizontal (SH) mode. This can suppress the intensity of higher-order modes.

Aspects of this disclosure relate to structures to suppress the higher order spurious modes for SAW filters on multi-layer substrate structures. For instance, SAW devices with a multi-layer piezoelectric that includes a lithium based piezoelectric material, such as lithium tantalate or lithium niobate, on silicon dioxide ($SiO_2$) on silicon can encounter higher order spurious modes. By replacing silicon with spinel in such multi-layer substrates, higher order spurious modes can be suppressed. The spinel layer can be a polycrystalline layer or a single crystalline layer. A number of SAW characteristics for spinel and silicon are similar. One difference lies in the shear velocity, where spinel is faster than silicon. Thus, the spurious modes can show up at higher frequencies on a spinel substrate compared to a silicon substrate. This characteristic can be used to suppress the higher order spurious modes for SAW filters.

FIG. 1A illustrates a cross section of a baseline surface acoustic wave device 10. The baseline surface acoustic device 10 includes a silicon substrate 12, a lithium tantalate layer 14 having a thickness of $H_1$, and an interdigital transducer (IDT) electrode 16 on the lithium tantalate layer 14 and having a thickness h. The illustrated IDT electrode 16 is an aluminum IDT electrode. The IDT electrode 16 has a pitch that sets the wavelength λ or L of a surface acoustic wave generated by the surface acoustic wave device 10. As illustrated, the wavelength λ of the surface acoustic wave is 2 micrometers (um). The silicon substrate 12 and the lithium tantalate layer 14 are bonded with each other and in physical contact with each other in the surface acoustic wave device 10.

Figure 1B:
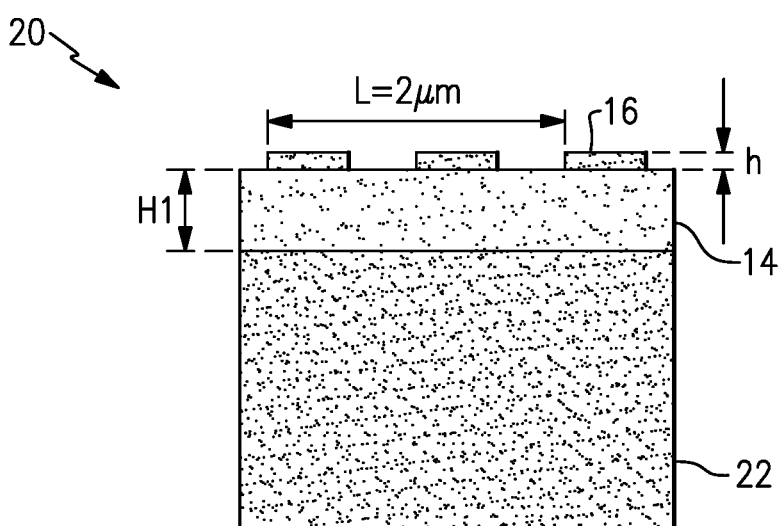
FIG. 1B illustrates a cross section of a surface acoustic wave device that includes a polycrystalline spinel substrate according to an embodiment.

FIG. 1B illustrates a cross section of a surface acoustic wave device 20 that includes a polycrystalline spinel substrate 22 according to an embodiment. The surface acoustic device 20 includes a polycrystalline spinel substrate 22, a lithium tantalate layer 14 having a thickness of $H_1$, and an IDT electrode 16. The surface acoustic wave device 20 is like the surface acoustic wave device 10 of FIG. 1A except that the surface acoustic wave device 20 includes the polycrystalline spinel substrate 22 in place of the silicon substrate 12.

The polycrystalline spinel substrate 22 can suppress substrate leakage and contribute to the surface acoustic wave device achieving a relatively high Q and providing desirable out-of-band attenuation characteristics. The polycrystalline spinel substrate 22 can be bonded with the lithium tantalate layer 14. The polycrystalline spinel substrate 22 can be in physical contact with the lithium tantalate layer 14 as illustrated. The polycrystalline spinel layer 22 has a chemical formula of $MgAl_2O_4$.

The thickness $H_1$ of the lithium tantalate layer 14 can be less than the wavelength λ of a surface acoustic wave generated by the surface acoustic wave device 20. This can contribute to the surface acoustic wave device 20 achieving a desired electromechanical coupling coefficient $k^2$. The lithium tantalate layer 14 is an example of a piezoelectric layer. A lithium niobate ($LiNbO_3$) piezoelectric layer can be implemented in place of a lithium tantalate layer in any of the embodiments discussed herein. Any other suitable piezoelectric layer can be implemented in place of the lithium tantalate layer 14.

The IDT electrode 16 is disposed on lithium tantalate layer 14. The IDT electrode 16 has a pitch that sets the wavelength λ of a surface acoustic wave generated by the surface acoustic wave device 20. The IDT electrode 16 can be an aluminum IDT electrode. IDT electrode material can include aluminum (Al), titanium (Ti), gold (Au), silver (Ag), copper (Cu), platinum (Pt), tungsten (W), molybdenum (Mo), ruthenium (Ru), or any suitable combination thereof. For instance, the IDT electrode 16 can include aluminum and molybdenum in certain applications. In some embodiments, the IDT electrode 16 can include multiple layers of different IDT electrode materials.

Figure 2A:
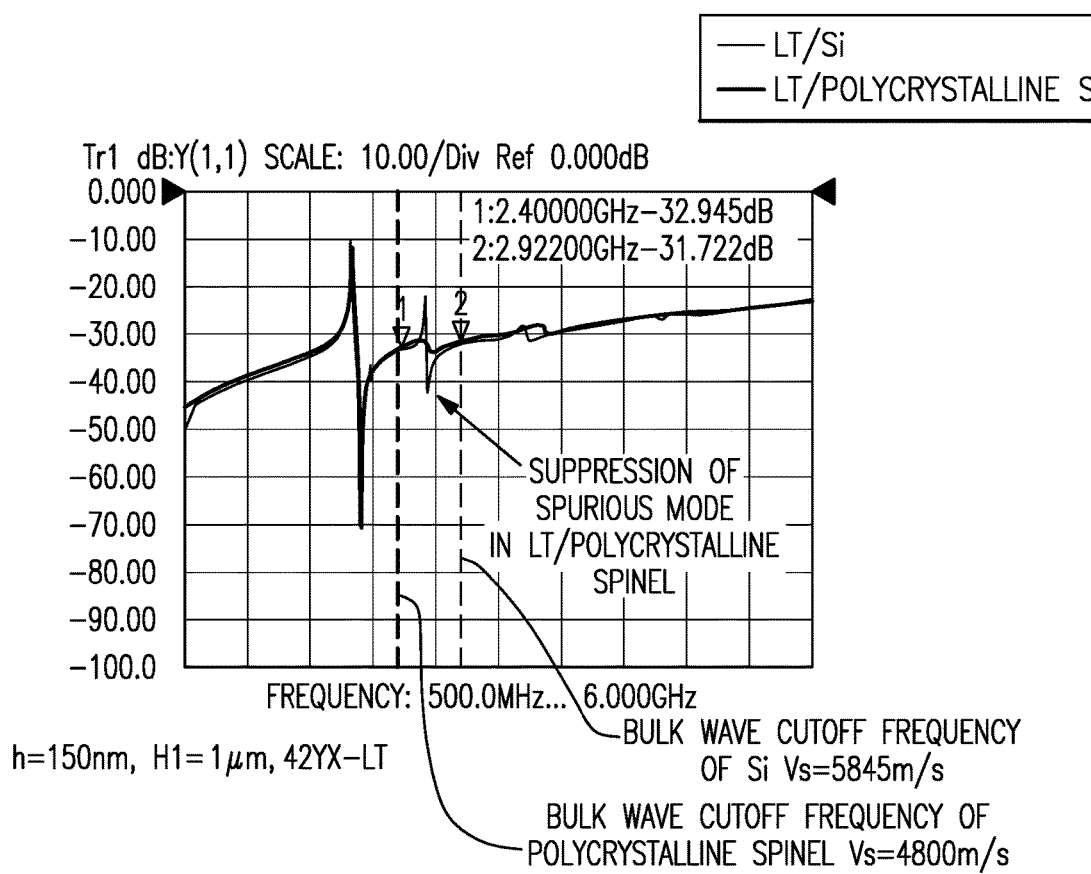
FIG. 2A is a graph comparing simulated frequency responses of the surface acoustic wave devices of FIGS. 1A and 1B.

FIG. 2A is a graph comparing simulated frequency responses of the surface acoustic wave devices 10 and 20 of FIGS. 1A and 1B, respectively. These simulations correspond to a wavelength λ of 2 um, an IDT electrode 16 having a thickness h of 150 nm, and a lithium tantalate layer 14 having a thickness H1 of 1 um and being 42YX-lithium tantalate. The bulk wave cutoff frequency of polycrystalline spinel (e.g., about 2.4 GHz) is lower than the bulk wave cutoff frequency for silicon (e.g., about 2.9 GHz). Accordingly, a spurious mode that is present in the surface acoustic wave device 10 can be suppressed in the surface acoustic wave device 20.

Figure 2B:
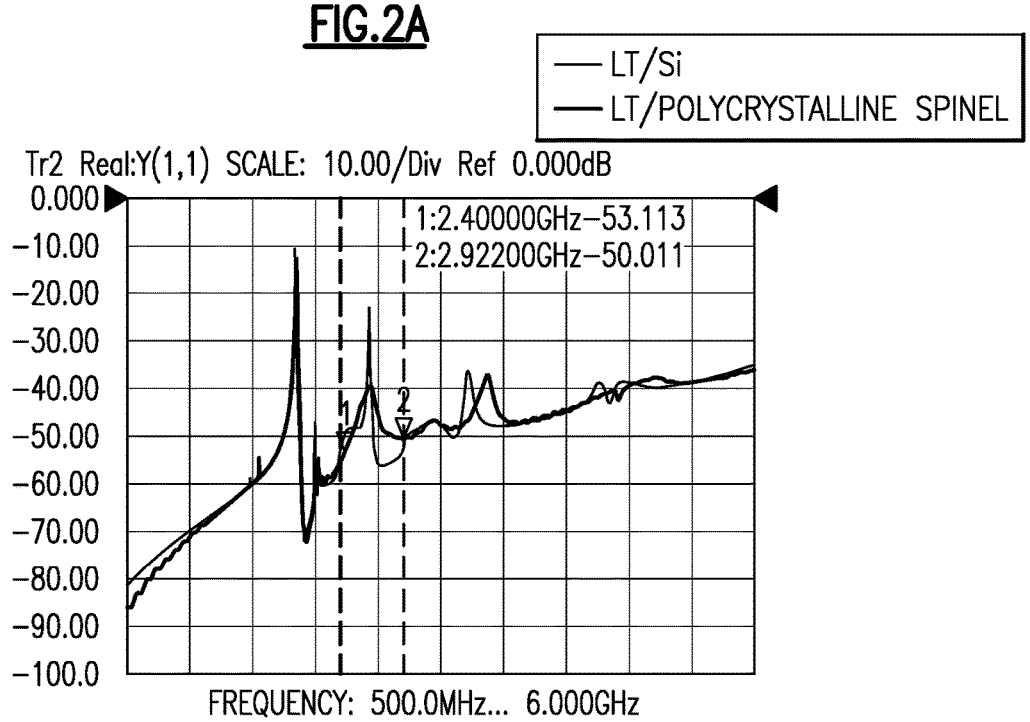
FIG. 2B is another graph comparing simulated frequency responses of the surface acoustic wave devices of FIGS. 1A and 1B.

FIG. 2B is another graph comparing simulated frequency responses of the surface acoustic wave devices 10 and 20 of FIGS. 1A and 1B, respectively. This graph indicates stronger suppression of a spurious mode in the surface acoustic wave device 20 than in the surface acoustic wave device 10.

Figure 2C:
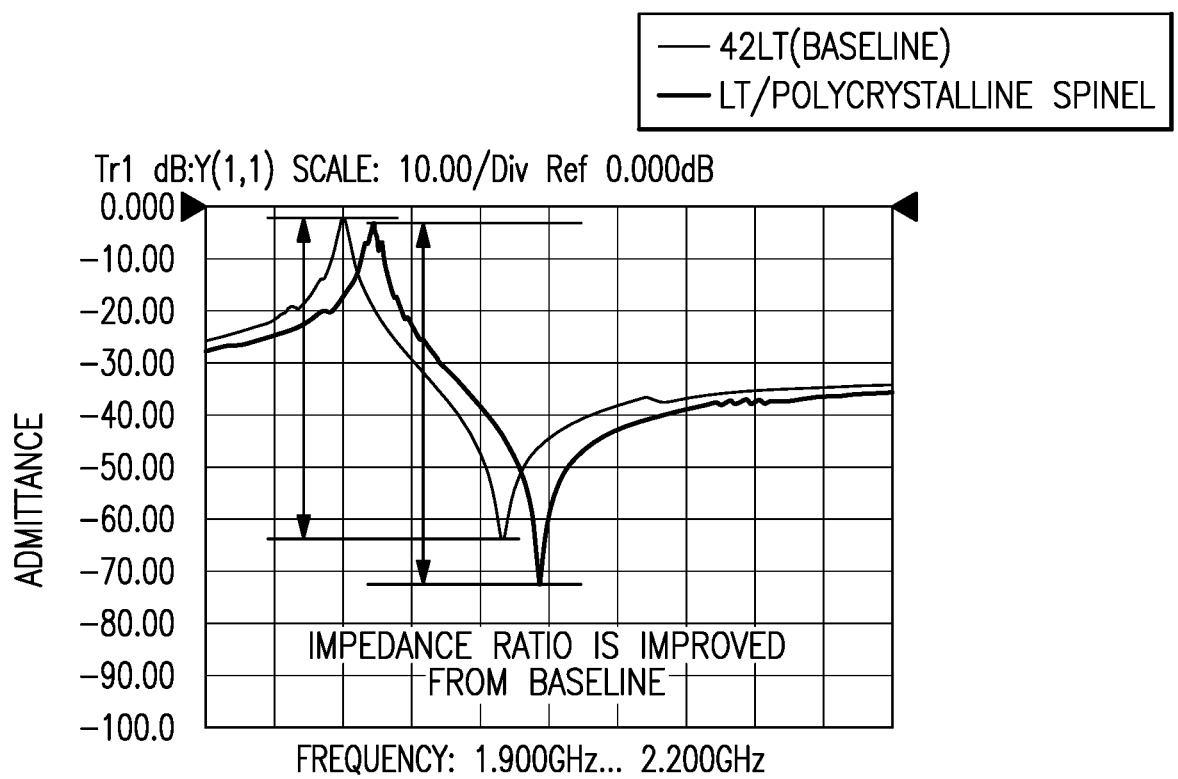
FIG. 2C is a graph comparing admittance over frequency for a surface acoustic wave device of FIG. 1B and a similar device without a spinel substrate.

FIG. 2C is a graph comparing admittance over frequency for a surface acoustic wave device of FIG. 1B and a similar device without a spinel substrate. The similar device is like the surface acoustic wave device 20 except that the polycrystalline spinel substrate 22 is not included. The lithium tantalate layer of the similar device has a 42° cut angle. FIG. 2C indicates that the impedance ratio is improved by the polycrystalline spinel layer 22 of FIG. 1B.

A temperature compensating layer with a positive temperature coefficient of frequency (TCF) can be added between a piezoelectric layer and the polycrystalline spinel substrate of the surface acoustic wave device 20 of FIG. 1B. This can bring the TCF of such a surface acoustic wave device closer to zero than the surface acoustic wave device 20 of FIG. 1B. Accordingly, there can be less variation with temperature for the surface acoustic wave device with the temperature compensating layer. This can be significant in certain applications.

The temperature compensating layer can be silicon dioxide ($SiO_2$) layer. The temperature compensating layer can be a layer of any other suitable material having a positive temperature coefficient of frequency. For instance, the temperature compensating layer can be a tellurium dioxide ($TeO_2$) layer or a silicon oxyfluoride (SiOF) layer in certain applications. A temperature compensating layer can include any suitable combination of, for example, $SiO_2$, $TeO_2$, and/or SiOF.

Figure 3A:
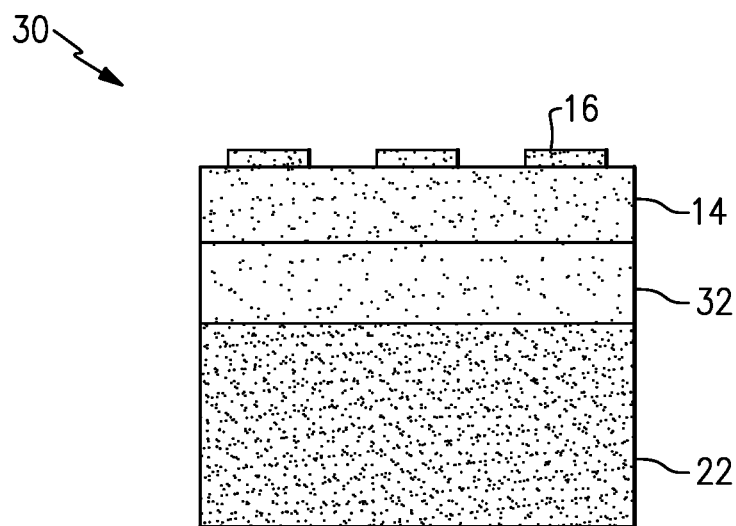
FIG. 3A illustrates a cross section of a surface acoustic wave device that includes a polycrystalline spinel substrate and a temperature compensating layer according to an embodiment.
Figure 3B:
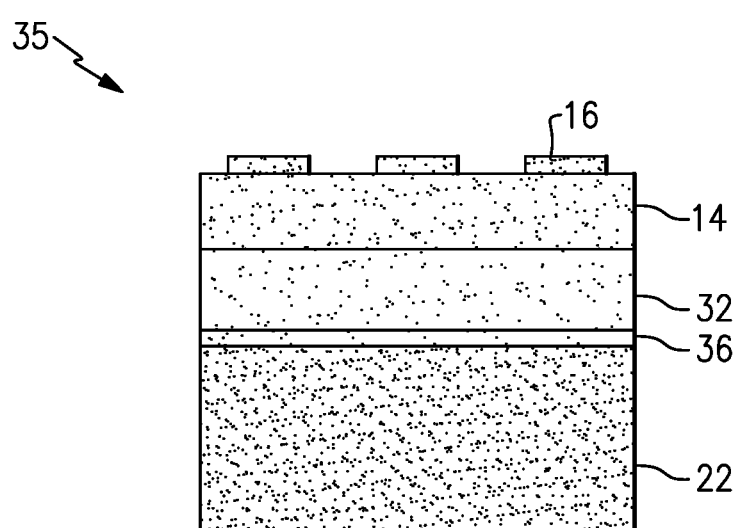
FIG. 3B illustrates a cross section of a surface acoustic wave device that includes a polycrystalline spinel substrate, a temperature compensating layer, and a high impedance layer according to an embodiment.

FIGS. 3A and 3B illustrate surface acoustic wave devices that include a temperature compensating layer in a multilayer piezoelectric substrate. Any suitable principles and advantages of these surface acoustic wave devices can be combined with each other and/or with any of the other surface acoustic wave devices discussed herein.

FIG. 3A illustrates a cross section of a surface acoustic wave device 30 that includes a polycrystalline spinel substrate 22 and a silicon dioxide layer 32 according to an embodiment. The silicon dioxide layer 32 can be any other suitable temperature compensating layer. The silicon dioxide layer 32 can bring the TCF of the surface acoustic wave device 30 closer to zero than the TCF of the surface acoustic wave device 20 of FIG. 1B. The silicon dioxide layer 32 can improve the electromechanical coupling coefficient $k^2$ of the surface acoustic wave device 30 relative to the surface acoustic wave device 20 of FIG. 1B.

FIG. 3B illustrates a cross section of a surface acoustic wave device 35 that includes a polycrystalline spinel substrate 22, a silicon dioxide layer 32, and a high impedance layer 36 according to an embodiment. The surface acoustic wave device 35 is like the surface acoustic wave device 30 of FIG. 3A except that the high impedance layer 36 is additionally implemented. The high impedance layer 36 has a higher impedance than the polycrystalline spinel substrate 22. The high impedance layer 36 can improve the quality factor of the surface acoustic wave device 35 relative to the surface acoustic wave device 30 of FIG. 3A. The high impedance layer 36 can be a silicon nitride (SiN) layer, an aluminum nitride (AlN) layer, or the like.

Another substrate can be included below a polycrystalline spinel substrate on a side opposite to the piezoelectric layer of a surface acoustic wave device. In such surface acoustic wave devices, the advantages of polycrystalline spinel can be realized and the other substrate can cause thermal dispersion and/or TCF to be improved.

Figure 4A:
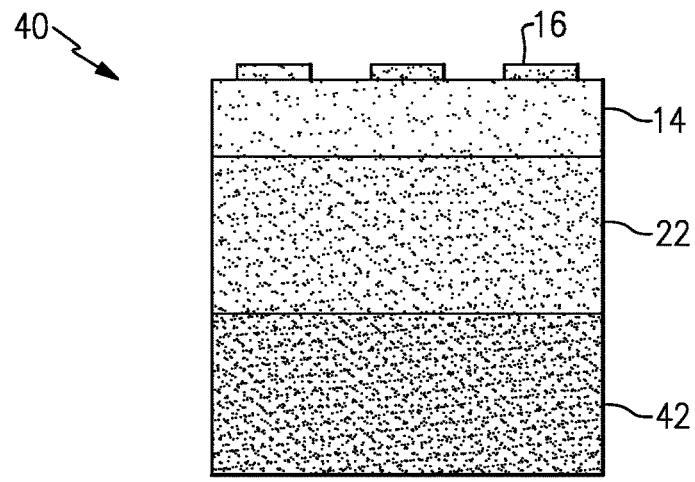
FIG. 4A illustrates a cross section of a surface acoustic wave device that includes a polycrystalline spinel substrate over another substrate according to an embodiment.
Figure 4B:
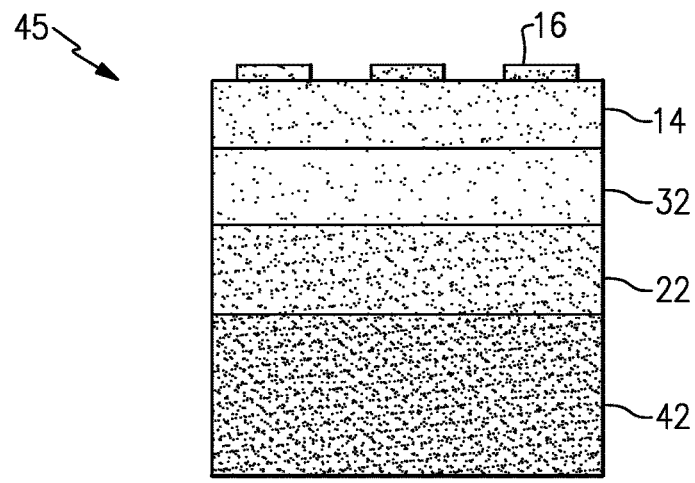
FIG. 4B illustrates a cross section of a surface acoustic wave device that includes a polycrystalline spinel substrate and a temperature compensating layer over another substrate according to an embodiment.
Figure 4C:
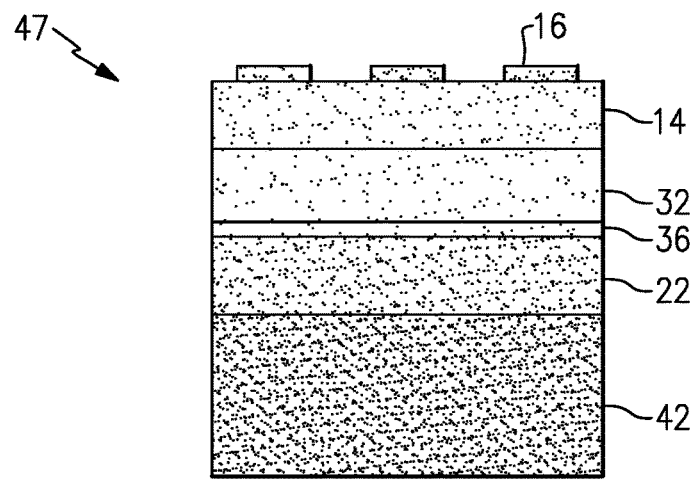
FIG. 4C illustrates a cross section of a surface acoustic wave device that includes a polycrystalline spinel substrate, a temperature compensating layer, and a high impedance layer over another substrate according to an embodiment.

FIGS. 4A to 4C illustrate surface acoustic wave devices that include a multi-layer piezoelectric substrate with a polycrystalline spinel substrate over another substrate. For example, in an embodiment, a surface acoustic wave device includes a support substrate (e.g. a silicon substrate), a polycrystalline layer over the support substrate, a piezoelectric layer (e.g., a lithium tantalate layer or a lithium niobate layer) over the polycrystalline spinel layer, and an interdigital transducer electrode over the piezoelectric layer. Any suitable principles and advantages of these surface acoustic wave devices can be combined with each other and/or with any of the other surface acoustic wave devices discussed herein.

FIG. 4A illustrates a cross section of a surface acoustic wave device 40 that includes a polycrystalline spinel substrate 22 over another substrate 42 according to an embodiment. The surface acoustic wave device 40 is like the surface acoustic wave device 20 of FIG. 1B except that the surface acoustic wave device 40 additionally includes the other substrate 42. As shown in FIG. 4A, polycrystalline spinel substrate 22 is disposed between the other substrate 42 and a piezoelectric layer (e.g., the lithium tantalate layer 14). The other substrate 42 can serve as a support substrate. The other substrate 42 can be any suitable substrate that can improve thermal dispersion and/or TCF. For example, the other substrate 42 can be a silicon (Si) substrate, an aluminum nitride (AlN) substrate, a diamond substrate, a silicon nitride (SiN) substrate, a silicon carbide (SiC) substrate, or the like. The other substrate 42 can be a monocrystalline substrate.

FIG. 4B illustrates a cross section of a surface acoustic wave device 45 that includes a polycrystalline spinel substrate 22 and a temperature compensating layer 32 over another substrate according to an embodiment. The surface acoustic wave device 45 is like the surface acoustic wave device 40 of FIG. 4A except that the surface acoustic wave device 45 additionally includes the temperature compensating layer (e.g., a silicon dioxide layer 32) between the polycrystalline spinel substrate 22 and the piezoelectric layer (e.g., the lithium tantalate layer 14).

FIG. 4C illustrates a cross section of a surface acoustic wave device 47 that includes a polycrystalline spinel substrate 22, a temperature compensating layer, and a high impedance layer 36 over another substrate 42 according to an embodiment. The surface acoustic wave device 47 is like the surface acoustic wave device 45 of FIG. 4B except that the surface acoustic wave device 47 additionally includes a high impedance layer 36 between the polycrystalline spinel substrate 22 and the temperature compensating layer (e.g., a silicon dioxide layer 32).

Figure 5A:
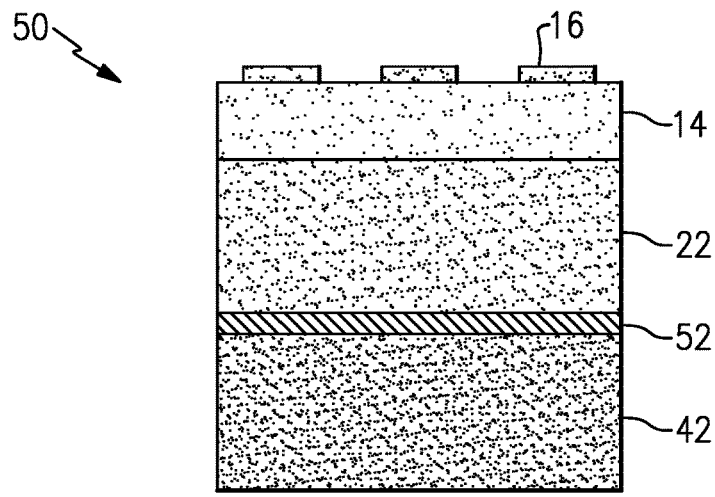
FIG. 5A illustrates a cross section of a surface acoustic wave device that includes a polycrystalline spinel substrate attached to another substrate by an adhesive layer according to an embodiment.
Figure 5B:
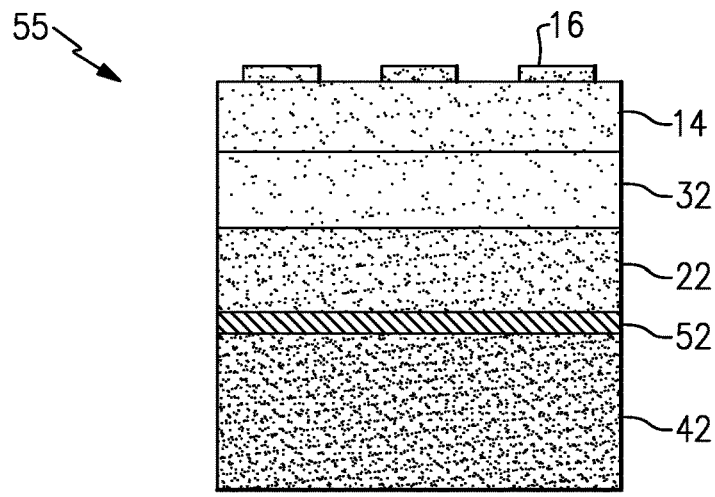
FIG. 5B illustrates a cross section of a surface acoustic wave device that includes a polycrystalline spinel substrate attached to another substrate by an adhesive layer according to another embodiment.
Figure 5C:
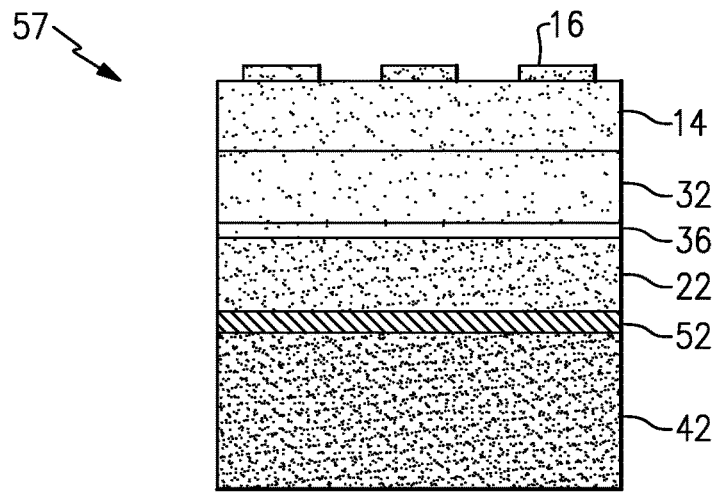
FIG. 5C illustrates a cross section of a surface acoustic wave device that includes a polycrystalline spinel substrate attached to another substrate by an adhesive layer according to another embodiment.

Although embodiments discussed herein relate to a surface acoustic wave device that includes polycrystalline spinel layer that is bonded to another layer of a multi-layer piezoelectric substrate, a polycrystalline spinel layer can be attached to another layer of a multi-layer piezoelectric substrate by an adhesive layer. FIGS. 5A to 5C illustrate surface acoustic wave devices that include a polycrystalline spinel substrate attached to another substrate by an adhesive layer. Any suitable principles and advantages of these surface acoustic wave devices can be combined with each other and/or with any of the other surface acoustic wave devices discussed herein.

FIG. 5A illustrates a cross section of a surface acoustic wave device 50 that includes a polycrystalline spinel substrate 22 attached to another substrate 42 by an adhesive layer 52. The surface acoustic wave device 50 is like the surface acoustic wave device 40 of FIG. 4A except that the surface acoustic wave device 50 additionally includes the adhesive layer 52.

FIG. 5B illustrates a cross section of a surface acoustic wave device 55 that includes a polycrystalline spinel substrate 22 attached to another substrate 42 by an adhesive layer 52. The surface acoustic wave device 55 is like the surface acoustic wave device 50 of FIG. 5A except that the surface acoustic wave device 55 additionally includes a silicon dioxide layer 32.

FIG. 5C illustrates a cross section of a surface acoustic wave device 57 that includes a polycrystalline spinel substrate 22 attached to another substrate 42 by an adhesive layer 52. The surface acoustic wave device 57 is like the surface acoustic wave device 55 of FIG. 5B except that the surface acoustic wave device 57 additionally includes a high impedance layer 36.

Although embodiments discussed herein relate to surface acoustic wave device that includes a polycrystalline spinel layer, a surface acoustic wave device can include a single crystalline spinel layer instead. For example, FIGS. 6B and 6C illustrate surface acoustic wave devices that include a single crystalline spinel substrate. In some embodiments, the polycrystalline spinel layer may suppress higher-order modes more than a single crystalline spinel layer. Any suitable principles and advantages of the other surface acoustic wave devices discussed herein can be implemented in association with the surface acoustic wave devices of FIGS. 6B and/or 6C.

Figure 6A:
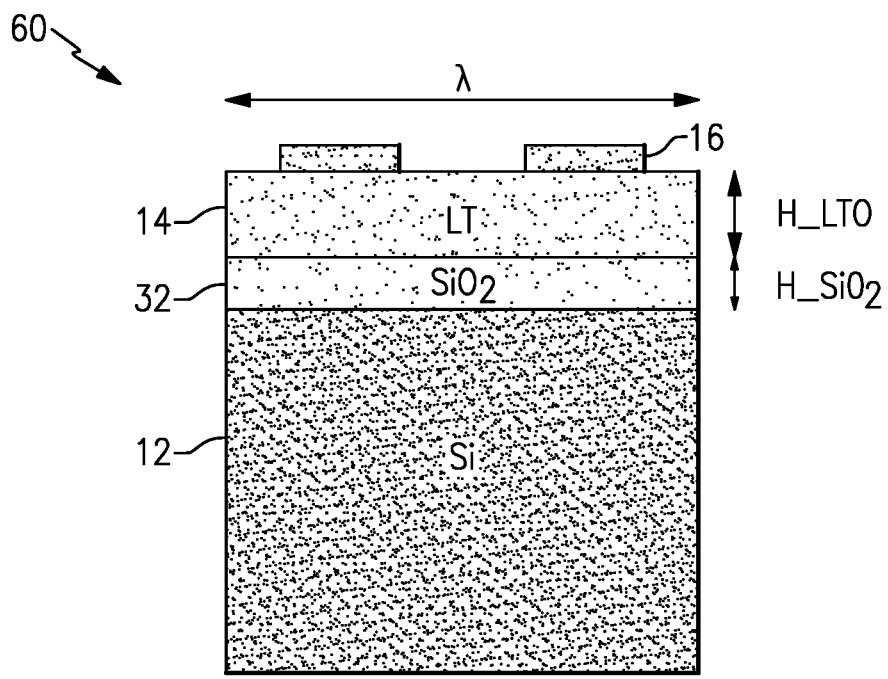
FIG. 6A illustrates a cross section of a baseline surface acoustic wave device.
Figure 6B:
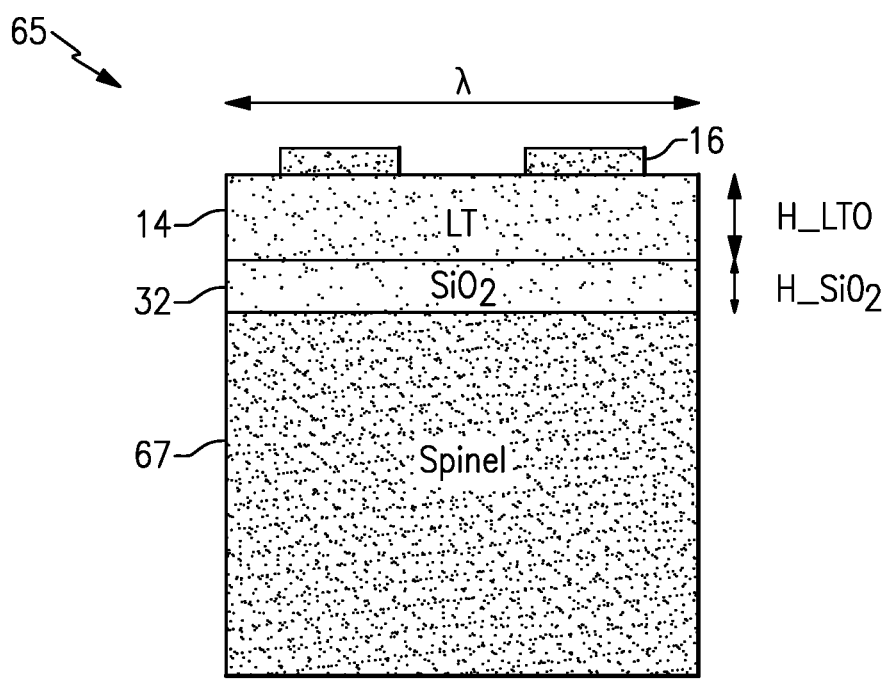
FIG. 6B illustrates a cross section of a surface acoustic wave device that includes a spinel substrate according to an embodiment.
Figure 6C:
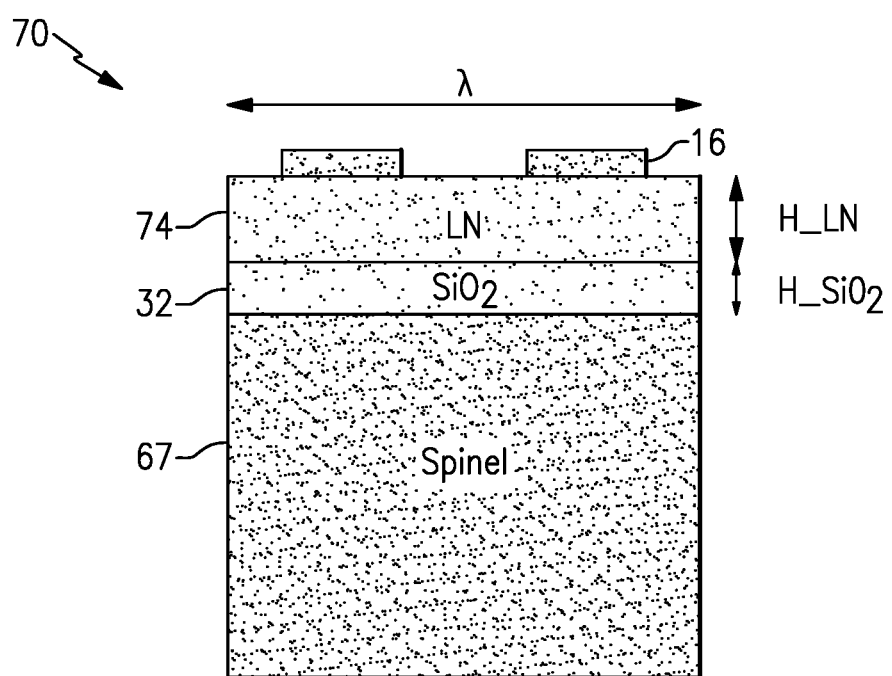
FIG. 6C illustrates a cross section of a surface acoustic wave device that includes a spinel substrate according to another embodiment.

FIG. 6A illustrates a cross section of a baseline surface acoustic wave device 60. The baseline surface acoustic device 60 includes a silicon substrate 12, a silicon dioxide layer 32, a lithium tantalate layer 14 having a thickness of H_LTO, and an aluminum IDT electrode 16 on the lithium tantalate layer 14. In the surface acoustic wave device 60, for example, the silicon dioxide layer 32 has a thickness $H\_SiO_2$ of 0.6 um, the aluminum IDT electrode 16 has a thickness of 160 nm and the IDT electrode 16 has a pitch of 2 um that sets the wavelength λ or L of a surface acoustic wave generated by the surface acoustic wave device 60.

FIG. 6B illustrates a cross section of a surface acoustic wave device 65 that includes a spinel substrate 67 according to an embodiment. The spinel substrate 67 is a single crystalline spinel substrate. As illustrated, the surface acoustic device 65 includes the spinel substrate 67, a lithium tantalate layer 14 having a thickness of H_LTO, a silicon dioxide layer 32 between the spinel substrate 67 and the lithium tantalate layer 14, and an IDT electrode 16. The surface acoustic wave device 65 is like the surface acoustic wave device 60 of FIG. 6A except that the surface acoustic wave device 65 includes a spinel substrate 67 in place of the silicon substrate 12. The surface acoustic wave device 65 is like the surface acoustic wave device 30 of FIG. 3A except that the surface acoustic wave device 65 includes the single crystalline spinel substrate 67 in place of the polycrystalline spinel substrate 22 and example dimensions for the surface acoustic wave device 65 are provided. In some embodiments, the lithium tantalate layer 14 is 42YX-lithium tantalate. In the surface acoustic wave device 65, for example, the silicon dioxide layer 32 can have a thickness $H\_SiO_2$ of 0.6 um, the aluminum IDT electrode 16 can have a thickness of 160 nm and the IDT electrode 16 can have a pitch of 2 um that sets the wavelength λ or L of a surface acoustic wave generated by the surface acoustic wave device 65. Other layer thicknesses and/or pitch can be implemented. The lithium tantalate layer 14 and the silicon dioxide layer 32 may have thicknesses H_LTO and H_SiO$_2$ that correspond to the pitch of the IDT electrode 16 that sets the wavelength λ or L.

FIG. 6C illustrates a cross section of a surface acoustic wave device 70 that includes a spinel substrate 67 according to an embodiment. The spinel substrate 67 is a single crystalline spinel substrate. As illustrated, the surface acoustic device 70 includes the spinel substrate 67, a lithium niobate layer 74 having a thickness of H_LN, a silicon dioxide layer 32 between the spinel substrate 67 and the lithium niobate layer 74, and an IDT electrode 16. The surface acoustic wave device 70 is like the surface acoustic wave device 65 of FIG. 6B except that the surface acoustic wave device 70 includes a different piezoelectric layer, namely the lithium niobate layer 74, in place of the lithium tantalate layer 14. In the surface acoustic wave device 70, as in other embodiments disclosed herein, various thicknesses and/or pitches can be implemented. For example, the lithium niobate layer 74 and the silicon dioxide layer 32 may have thicknesses H_LN and H_SiO$_2$ that correspond to a pitch of the IDT electrode 16 that sets the wavelength λ or L of a surface acoustic wave generated by the surface acoustic wave device 70.

As noted above, any suitable principles and advantages of the other surface acoustic wave devices discussed herein can be implemented in association with the surface acoustic wave devices of FIGS. 6B and/or 6C. In some embodiments, the spinel layer 67 of the surface acoustic wave devices 65 and/or 70 may be disposed over another substrate similar to the other substrate 42 of the surface acoustic wave device 55 of FIG. 5B. For example, the other substrate can be a silicon (Si) substrate, an aluminum nitride (AlN) substrate, a diamond substrate, a silicon nitride (SiN) substrate, a silicon carbide (SiC) substrate, or the like. In some embodiments, a high impedance layer, similar to the high impedance layer 36 of the surface acoustic wave device 57 of FIG. 5C, can be disposed between the silicon dioxide layer 32 and the spinel layer 67. According to certain embodiments, the spinel layer 67 can be disposed between a high impedance layer and another substrate layer.

The surface acoustic wave devices 60 and 65 of FIGS. 6A and 6B, respectively, were simulated with various thicknesses H_LTO of a 42YX-lithium tantalate layer. In these simulations, the material properties in Table 1 were used, the thickness H_SiO$_2$ of the silicon dioxide layer 32 was 0.6 um, and pitch λ was 2 um.

TABLE 1

| Material | Shear V$_{S2}$ [m/s] | Longitudinal V$_P$ [m/s] |
|---|---|---|
| SiO$_2$ | 2126 | 5501 |
| Si | 5086 | 13695 |
| Spinel | 5570 | 9782 |

Figure 7A:
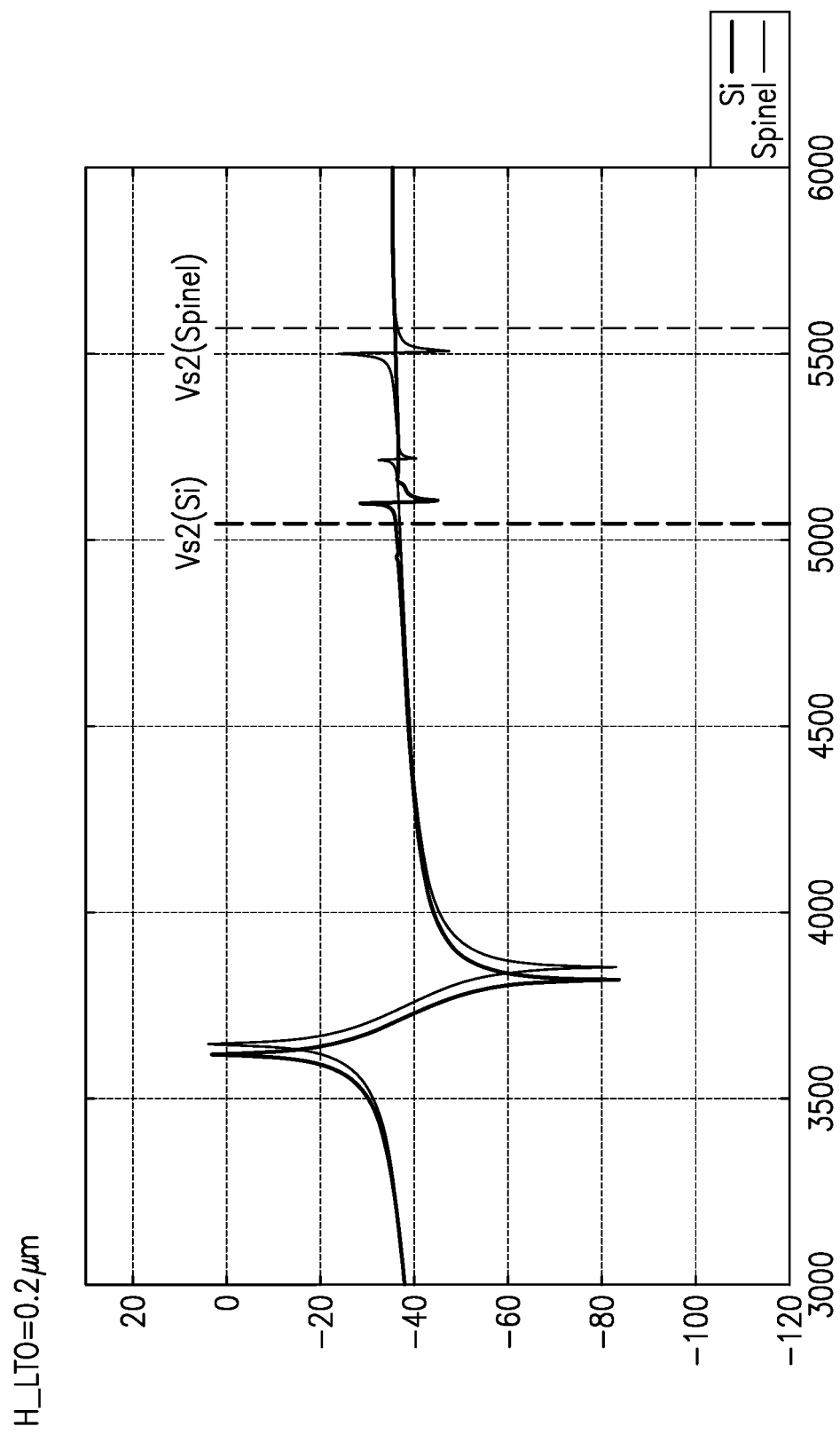
FIG. 7A is a graph comparing simulated frequency responses of the surface acoustic wave devices of FIGS. 6A and 6B for a first piezoelectric layer thickness.

FIG. 7A is a graph comparing simulated frequency responses of the surface acoustic wave devices 60 and 65 of FIGS. 6A and 6B, respectively, for H_LTO=0.2 um. As shown in FIG. 7A, spurious modes are at higher frequencies for the surface acoustic wave device 65 than for the surface acoustic wave device 60.

Figure 7B:
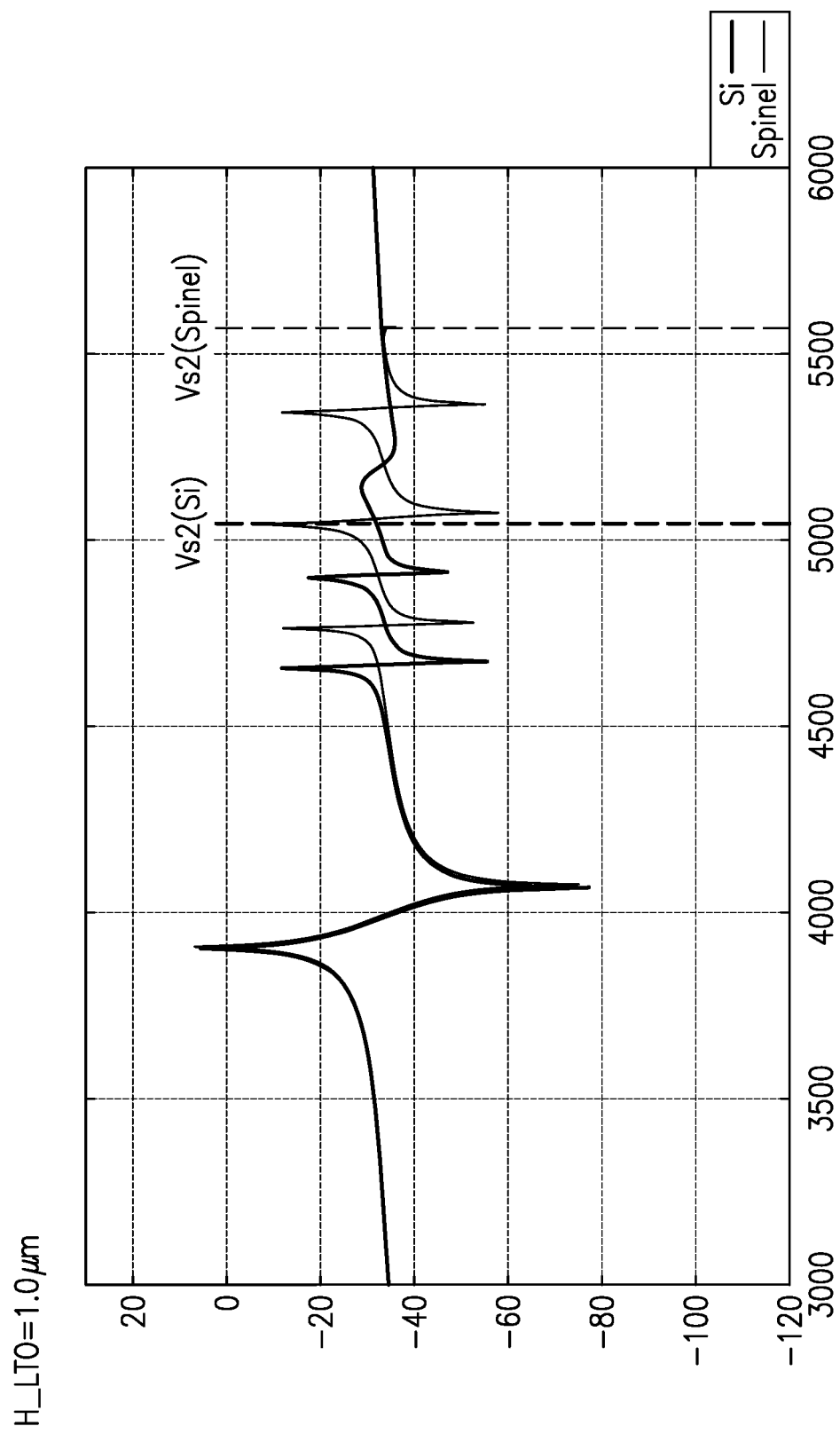
FIG. 7B is a graph comparing simulated frequency responses of the surface acoustic wave devices of FIGS. 6A and 6B for a second piezoelectric layer thickness.

FIG. 7B is a graph comparing simulated frequency responses of the surface acoustic wave devices 60 and 65 of FIGS. 6A and 6B, respectively, for H_LTO=1 um. FIG. 7B indicates that spurious modes are at higher frequencies for the surface acoustic wave device 65 than for the surface acoustic wave device 60.

Figure 7C:
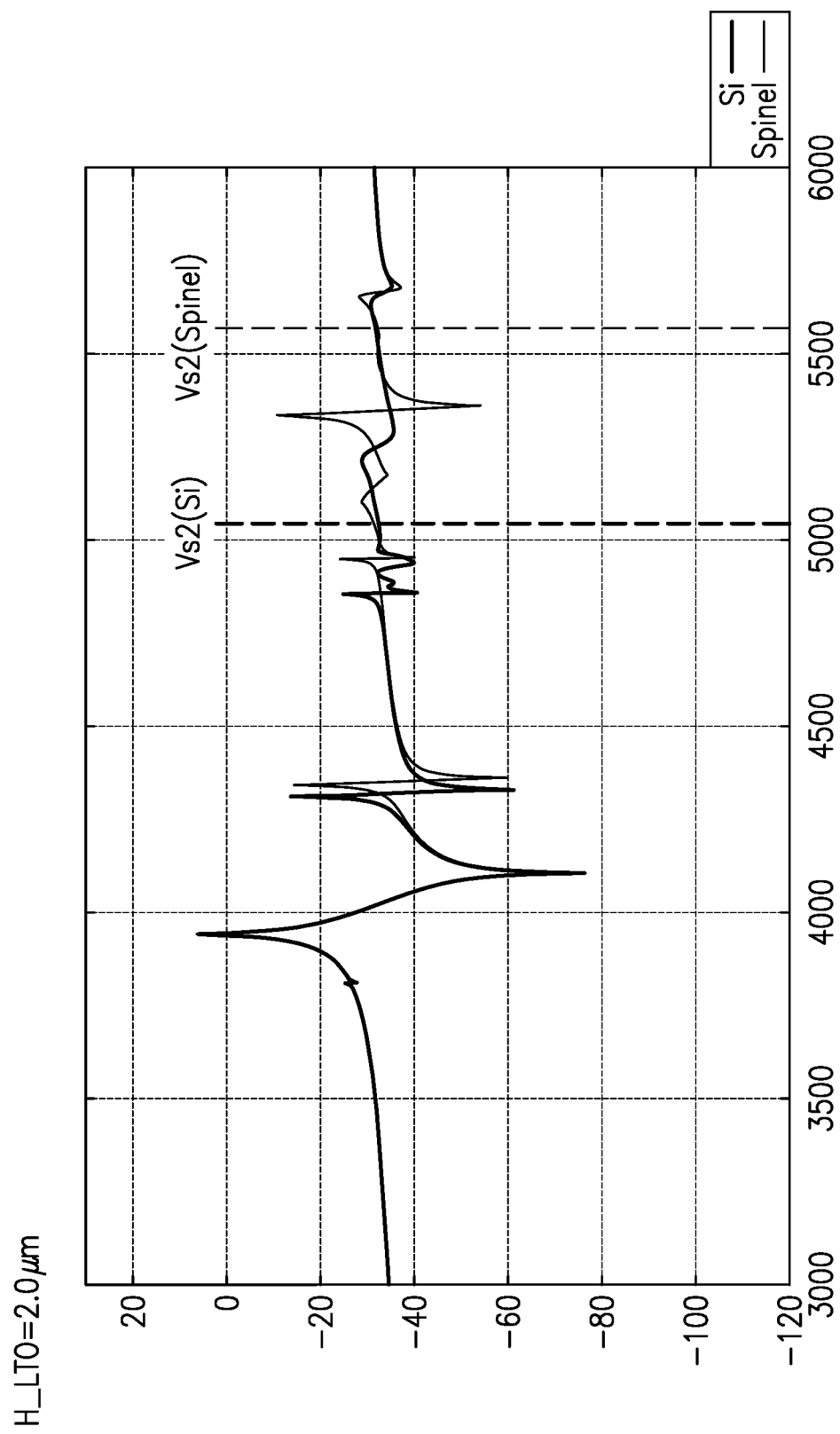
FIG. 7C is a graph comparing simulated frequency responses of the surface acoustic wave devices of FIGS. 6A and 6B for a third piezoelectric layer thickness.

FIG. 7C is a graph comparing simulated frequency responses of the surface acoustic wave devices 60 and 65 of FIGS. 6A and 6B, respectively, for H_LTO=2 um. Spurious modes are at higher frequencies for the surface acoustic wave device 65 than for the surface acoustic wave device 60 in FIG. 7C.

Figure 7D:
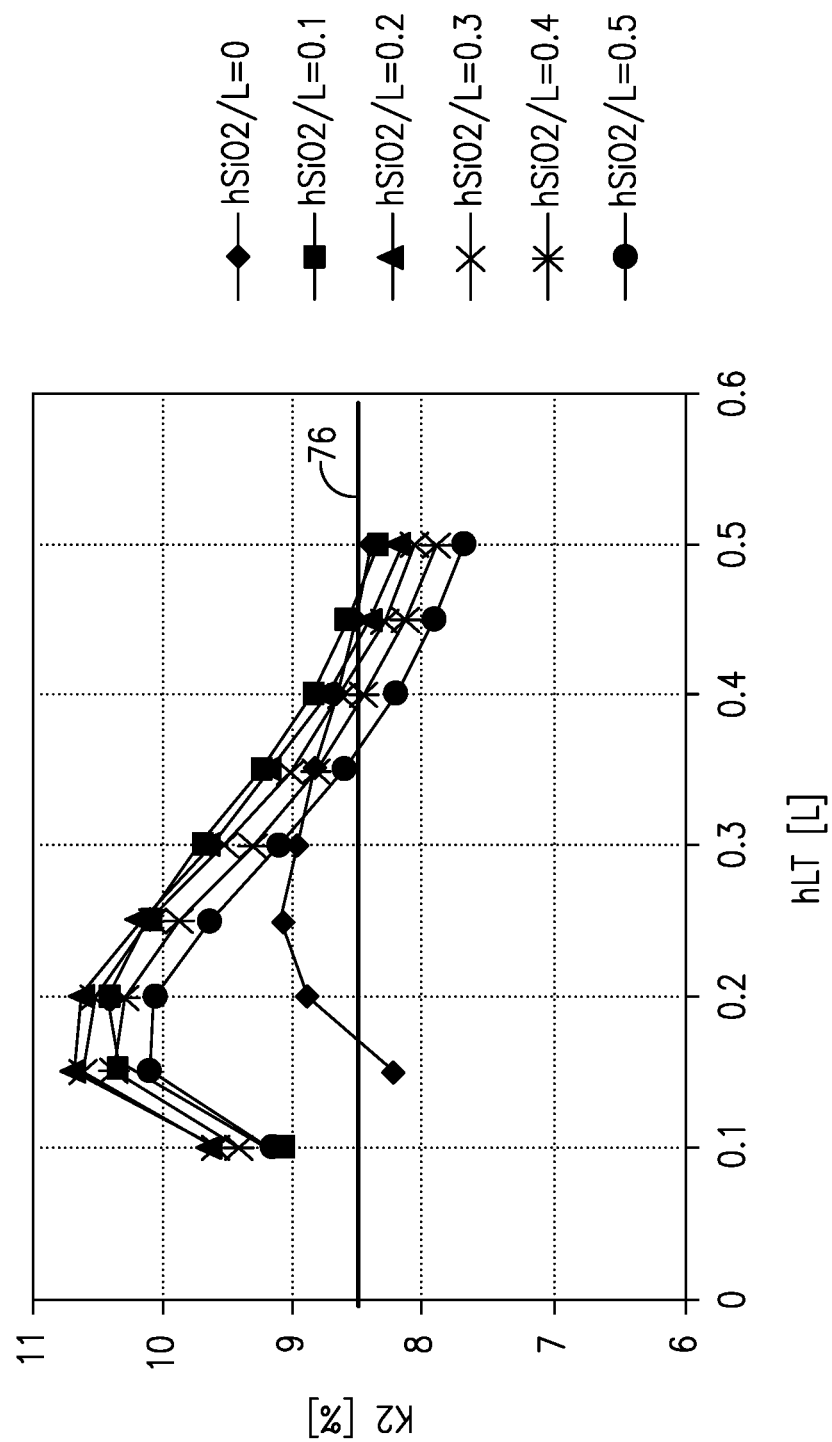
FIG. 7D is a graph of electromechanical coupling coefficient ($k^2$) versus lithium tantalate thickness for various silicon dioxide layer thicknesses for the surface acoustic wave devices shown of FIG. 6B.

FIG. 7D is a graph of various simulation results showing an electromechanical coupling coefficient (K$^2$) on a vertical axis and the thickness H_LTO of the lithium tantalate layer 14 on a horizontal axis for the surface acoustic wave devices 65 of FIG. 6B for various silicon dioxide layer thicknesses H_SiO$_2$/L=0 um, 0.1 um, 0.2 um, 0.3 um, 0.4 um, and 0.5 um. A line 76 at about K$^2$=8.5% is shown for a surface acoustic wave device with an IDT over a 42YX-lithium tantalate layer without other layers below the 42YX-lithium tantalate layer. For achieving desirable K$^2$ values, the simulation results indicate that the layer thickness combinations in rows of Table 2 are desirable.

TABLE 2

| Range for H_SiO$_2$ | Corresponding Range for H_LTO |
|---|---|
| 0λ < H_SiO$_2$ < 0.05λ | 0.17λ < H_LTO < 0.45λ |
| 0.05λ < H_SiO$_2$ < 0.15λ | 0.08λ < H_LTO < 0.45λ |
| 0.15λ < H_SiO$_2$ < 0.25λ | 0.08λ < H_LTO < 0.42λ |
| 0.25λ < H_SiO$_2$ < 0.35λ | 0.08λ < H_LTO < 0.41λ |
| 0.35λ < H_SiO$_2$ < 0.45λ | 0.08λ < H_LTO < 0.39λ |
| 0.45λ < H_SiO2 < 0.55λ | 0.08λ < H_LTO < 0.36λ |

The acoustic wave devices disclosed herein can be implemented in acoustic wave filters arranged to filter radio frequency signals. Aspects of this disclosure relate to filtering a radio frequency signal with an acoustic wave filter. A method can include providing a radio frequency signal to an acoustic wave filter. The radio frequency signal can provided via a radio frequency switch, for example. In some instances, a power amplifier can provide the radio frequency signal to the acoustic wave filter via the radio frequency switch. The method includes filtering the radio frequency signal with the acoustic wave filter. The acoustic wave filter can include any suitable acoustic wave device disclosed herein. For example, the acoustic wave filter can include an acoustic wave device that includes a spinel layer, a piezoelectric layer, and an interdigital transducer electrode on the piezoelectric layer, in which the piezoelectric layer is disposed between the interdigital transducer electrode and the spinel layer. The piezoelectric layer can have a thickness than is less than λ, in which the acoustic wave device is configured to generate an acoustic wave having a wavelength of λ. The spinel layer can be a polycrystalline spinel layer. The acoustic wave device can include a temperature compensating layer, such as a silicon dioxide layer, between the piezoelectric layer and the spinel layer. In the method, the radio frequency signal can be filtered while higher-order modes are suppressed.

Figure 8A:
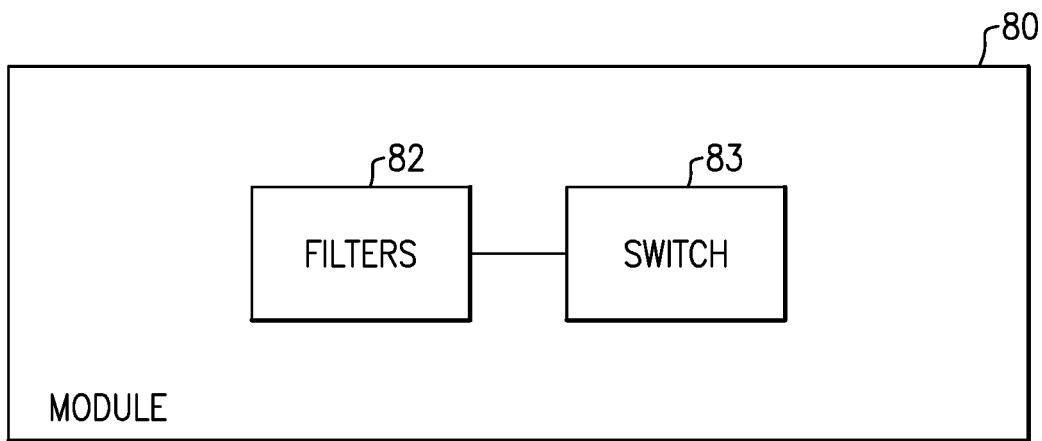
FIG. 8A is a schematic block diagram of a module with a filter that includes a surface acoustic wave device according to an embodiment.
Figure 8B:
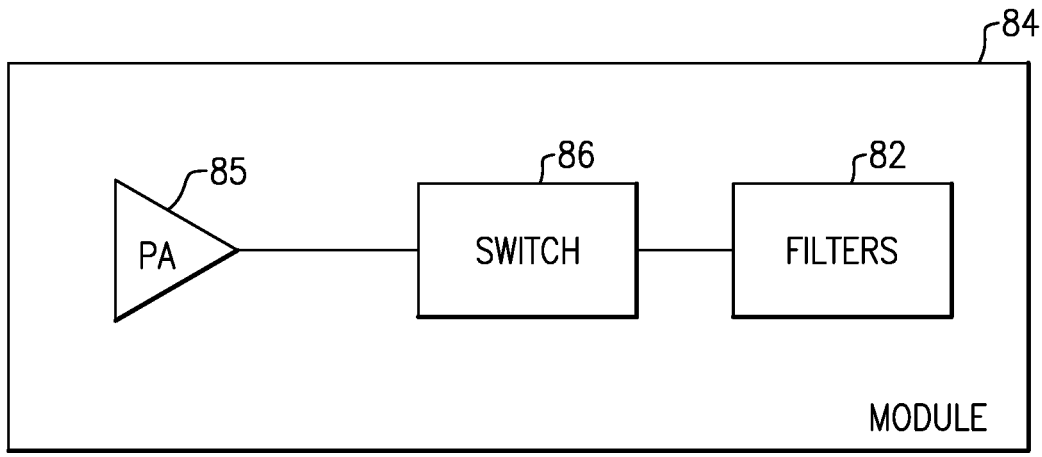
FIG. 8B is a schematic block diagram of a module with a filter that includes a surface acoustic wave device according to another embodiment.
Figure 8C:
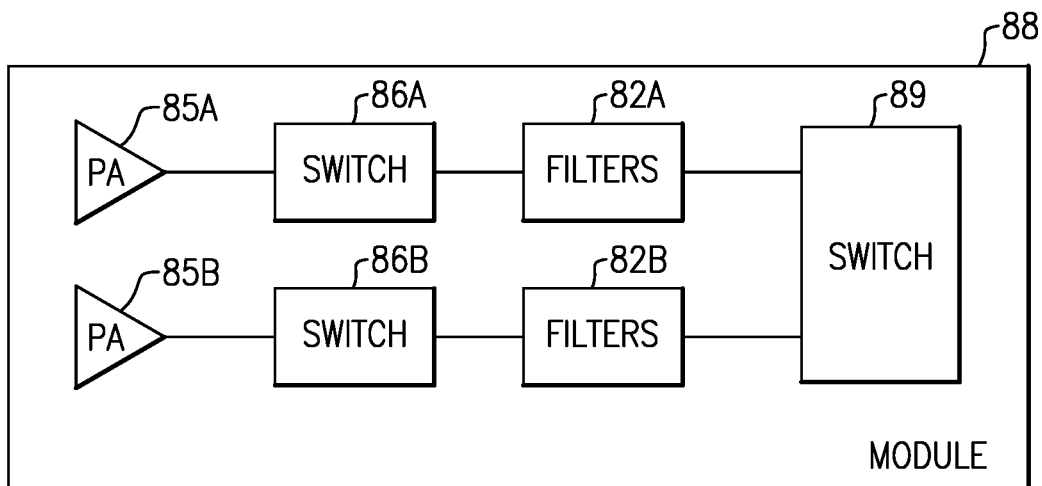
FIG. 8C is a schematic block diagram of a module with a filter that includes a surface acoustic wave device according to another embodiment.
Figure 8D:
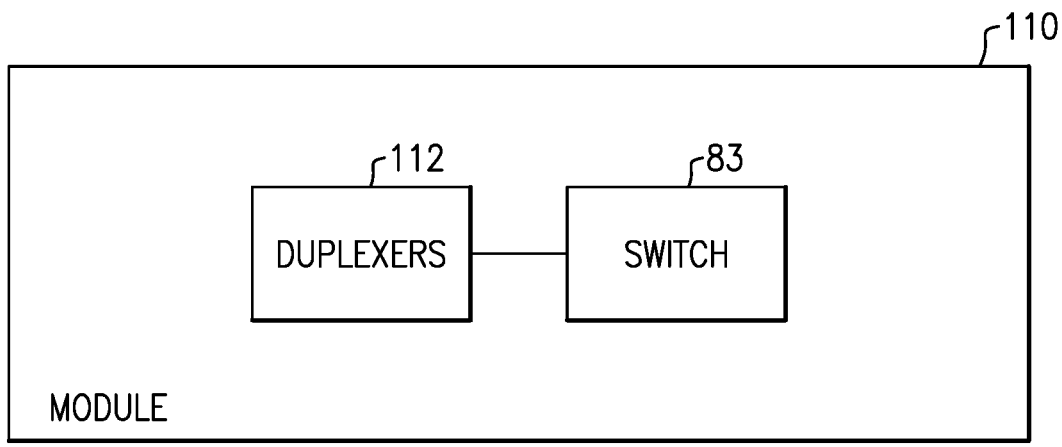
FIG. 8D is a schematic block diagram of a module with duplexers that include a surface acoustic wave device according to an embodiment.
Figure 8E:
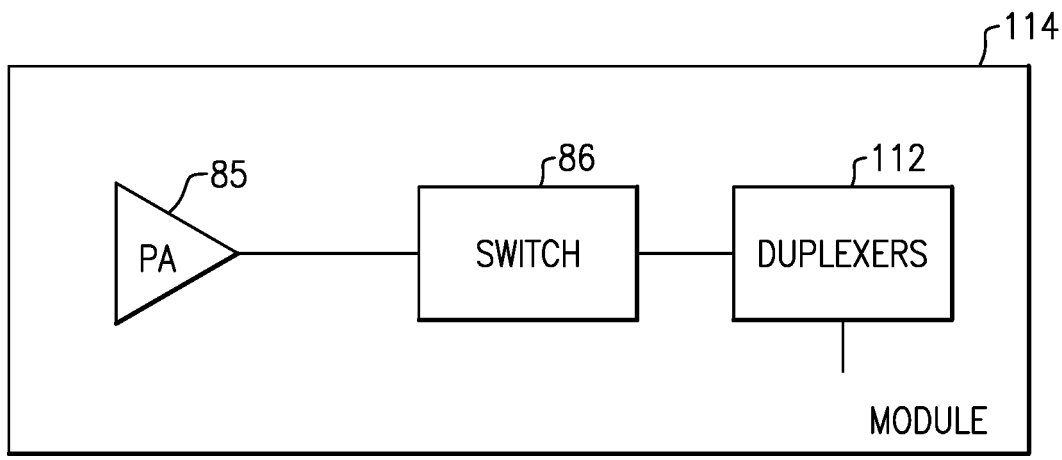
FIG. 8E is a schematic block diagram of a module with duplexers that include a surface acoustic wave device according to another embodiment.
Figure 8F:
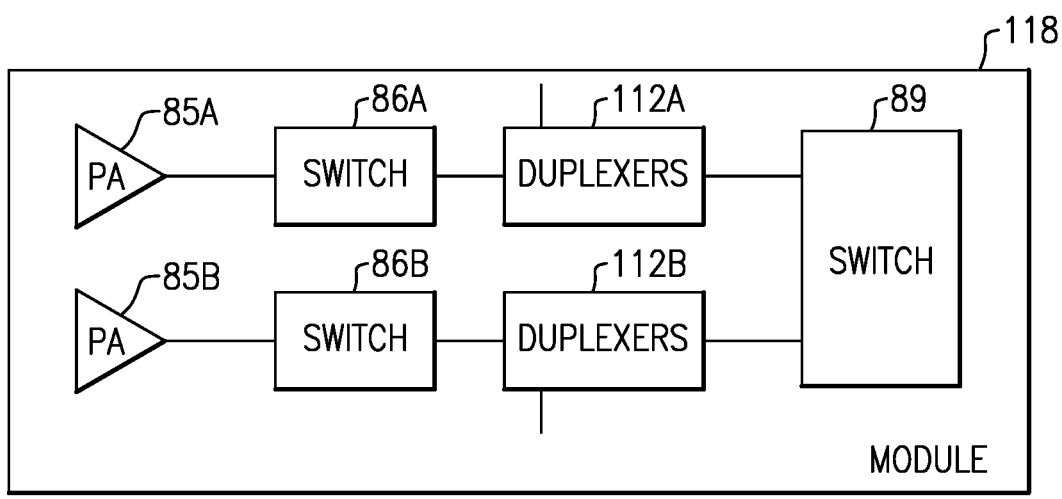
FIG. 8F is a schematic block diagram of a module with duplexers that include a surface acoustic wave device according to another embodiment.

The acoustic wave devices discussed herein can be implemented in a variety of packaged modules. A packaged module configured to process a radio frequency signal can be referred to as a radio frequency module. Some example packaged modules will now be discussed in which any suitable principles and advantages of the acoustic wave devices discussed herein can be implemented. FIGS. 8A to 8F are schematic block diagrams of illustrative packaged modules according to certain embodiments. Any suitable combination of features of these embodiments can be combined with each other. FIGS. 8A to 8C illustrate modules that include filters that includes an acoustic device in accordance with the principles and advantages disclosed herein. FIGS. 8D to 8F illustrate modules that include duplexers that includes an acoustic device in accordance with the principles and advantages disclosed herein. Although FIGS. 8D to 8F illustrate duplexers, any suitable principles and advantages disclosed herein can be implemented in other multiplexers (e.g., quadplexers, hexaplexers, octoplexers, etc.) and/or in switch-plexers.

FIG. 8A is a schematic block diagram of a module 80 that includes filters 82 and a switch 83. The module 80 can include a package that encloses the illustrated elements. The filters 82 and the switch 83 can be disposed on a common packaging substrate. The packaging substrate can be a laminate substrate, for example. The switch 83 can be a multi-throw radio frequency switch. The switch 83 can electrically couple a selected filter of the filters 82 to a common node. The common node can be an antenna node, for example. As another example, the common node can be coupled to an output of a power amplifier. The filters 82 can include any suitable number of acoustic wave filters. One or more of the acoustic wave filters of the filters 82 can be implemented in accordance with any suitable principles and advantages of the acoustic wave devices discussed herein.

FIG. 8B is a schematic block diagram of a module 84 that includes a power amplifier 85, a switch 86, and filters 82 in accordance with one or more embodiments. The module 84 can include a package that encloses the illustrated elements. The power amplifier 85, the switch 86, and the filters 82 can be disposed on a common packaging substrate. The packaging substrate can be a laminate substrate, for example. The switch 86 can be a multi-throw radio frequency switch. The switch 86 can electrically couple an output of the power amplifier 85 to a selected filter of the filters 82. The filters 82 can include any suitable number of acoustic wave filters. One or more of the acoustic wave filters of the filters 82 can be implemented in accordance with any suitable principles and advantages of the acoustic wave devices discussed herein.

FIG. 8C is a schematic block diagram of a module 88 that includes power amplifiers 85A and 85B, switches 86A and 86B, and filters 82A and 82B, and switch 89. The module 88 can include a package that encloses the illustrated elements. The illustrated elements can be disposed on a common packaging substrate. The packaging substrate can be a laminate substrate, for example. The module 88 is like the module 84 of FIG. 8B, except that the module 88 includes an additional power amplifier 85B, an additional switch 86B, additional filters 82B, and an antenna switch 89. The antenna switch 89 can selectively couple a signal from the filters 82A or the filters 82B to an antenna node. The different signal paths can be associated with different frequency bands and/or different modes of operation (e.g., different power modes, different signaling modes, etc.).

FIG. 8D is a schematic block diagram of a module 110 that includes duplexers 112 and a switch 83. The module 110 can include a package that encloses the illustrated elements. The duplexers 112 and the switch 83 can be disposed on a common packaging substrate. The packaging substrate can be a laminate substrate, for example. The duplexers 112 can include two or more filters coupled to a common node. The switch 83 can electrically couple a selected duplexer of the duplexers 112 to a common node. The common node can be an antenna node, for example. As another example, the common node can be coupled to an output of a power amplifier.

One or more duplexers of the duplexers 112 can be implemented by any other suitable multiplexer that includes a plurality of filters coupled to each other at a common node. In some embodiments, such a multiplexer can be a quadplexer. The multiplexer can be a pentaplexer. The multiplexer can be a hexaplexer. The multiplexer can be a heptaplexer. The multiplexer can be an octoplexer.

FIG. 8E is a schematic block diagram of a module 114 that includes a power amplifier 85, a switch 86, and duplexers 112 in accordance with one or more embodiments. The module 114 can include a package that encloses the illustrated elements. The power amplifier 85, the switch 86, and the duplexers 112 can be disposed on a common packaging substrate. The packaging substrate can be a laminate substrate, for example. The switch 86 can be a multi-throw radio frequency switch. The switch 86 can electrically couple an output of the power amplifier 85 to a selected duplexer of the duplexers 112. The duplexers 112 can each include two acoustic wave filters coupled to a common node. The two acoustic wave filters can be a transmit filter and a receive filter.

FIG. 8F is a schematic block diagram of a module 118 that includes power amplifiers 85A and 85B, switches 86A and 86B, and duplexers 112A and 112B, and switch 89. The module 118 can include a package that encloses the illustrated elements. The illustrated elements can be disposed on a common packaging substrate. The packaging substrate can be a laminate substrate, for example. The module 118 is like the module 114 of FIG. 8E, except that the module 118 includes an additional power amplifier 85B, an additional switch 86B, additional duplexers 112B, and an antenna switch 89. The antenna switch 89 can selectively couple a signal from the duplexers 112A or the duplexers 112B to an antenna node. The different signal paths can be associated with different frequency bands and/or different modes of operation (e.g., different power modes, different signaling modes, etc.).

Figure 9A:
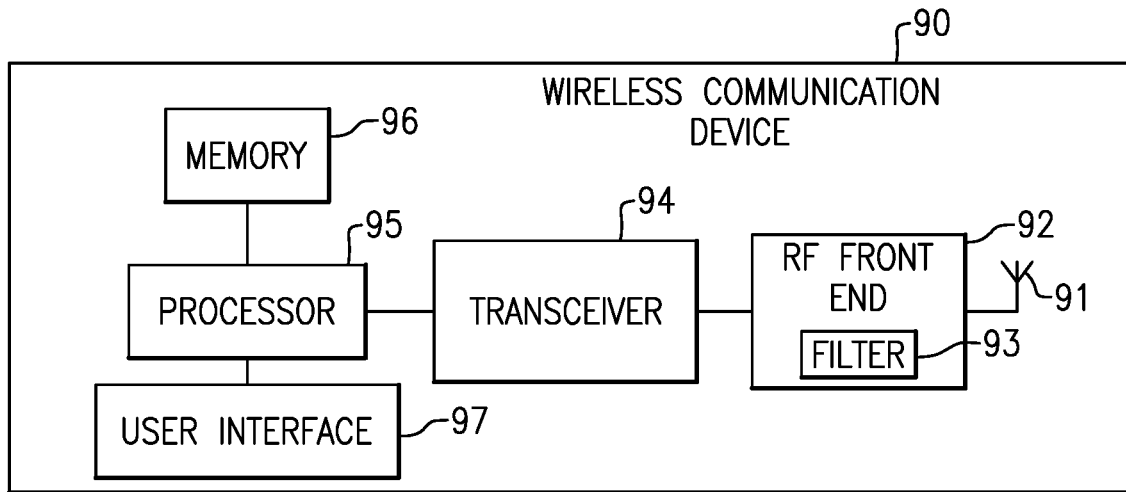
FIG. 9A is a schematic block diagram of a wireless communication device that includes a filter in accordance with one or more embodiments.

FIG. 9A is a schematic diagram of a wireless communication device 90 that includes a filter 93 in a radio frequency front end 92 according to an embodiment. The filter 93 can include an acoustic wave device in accordance with any suitable principles and advantages discussed herein. The wireless communication device 90 can be any suitable wireless communication device. For instance, a wireless communication device 90 can be a mobile phone, such as a smart phone. In some other instances, the wireless communication device 90 can be an Internet of things device, a laptop or notebook computer, or a tablet computer. As illustrated, the wireless communication device 90 includes an antenna 91, an RF front end 92, a transceiver 94, a processor 95, a memory 96, and a user interface 97. The antenna 91 can transmit RF signals provided by the RF front end 92. Such RF signals can include carrier aggregation signals. The antenna 91 can provide received RF signals to the RF front end 92 for processing. Such RF signals can include carrier aggregation signals.

The RF front end 92 can include one or more power amplifiers, one or more low noise amplifiers, RF switches, receive filters, transmit filters, duplex filters, multiplexers, frequency multiplexing circuits, or any combination thereof. The RF front end 92 can transmit and receive RF signals associated with any suitable communication standards. The filter 93 can include a surface acoustic wave device that includes any suitable combination of features discussed with reference to any embodiments discussed above.

The transceiver 94 can provide RF signals to the RF front end 92 for amplification and/or other processing. The transceiver 94 can also process an RF signal provided by a low noise amplifier of the RF front end 92. The transceiver 94 is in communication with the processor 95. The processor 95 can be a baseband processor. The processor 95 can provide any suitable base band processing functions for the wireless communication device 90. The memory 96 can be accessed by the processor 95. The memory 96 can store any suitable data for the wireless communication device 90. The user interface 97 can be any suitable user interface, such as a display with touch screen capabilities.

Figure 9B:
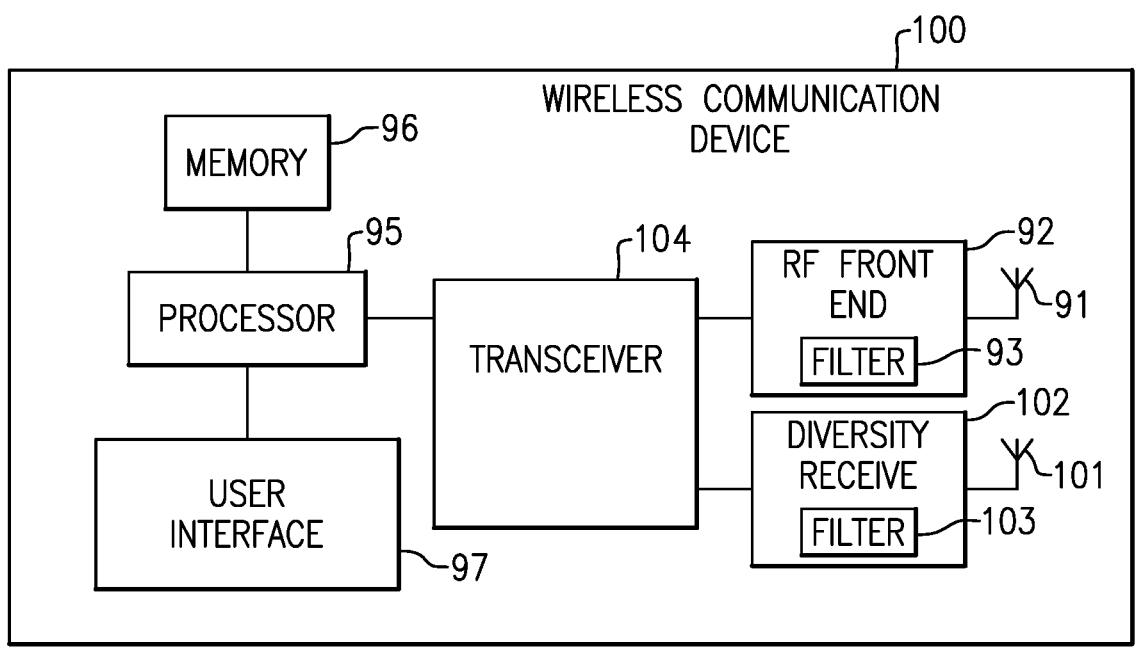
FIG. 9B is a schematic block diagram of another wireless communication device that includes a filter in accordance with one or more embodiments.

FIG. 9B is a schematic diagram of a wireless communication device 100 that includes a filter 93 in a radio frequency front end 92 and a second filter 103 in a diversity receive module 102. The wireless communication device 100 is like the wireless communication device 90 of FIG. 9A, except that the wireless communication device 100 also includes diversity receive features. As illustrated in FIG. 9B, the wireless communication device 100 includes a diversity antenna 101, a diversity module 102 configured to process signals received by the diversity antenna 101 and including the second filter 103, and a transceiver 104 in communication with both the radio frequency front end 92 and the diversity receive module 102. The second filter 103 can include a surface acoustic wave device that includes any suitable combination of features discussed with reference to any embodiments discussed above.

Although embodiments are discussed with reference to surface acoustic wave devices, any suitable principles and advantages discussed herein can be applied to boundary acoustic wave devices, Lamb wave resonators, and/or other suitable acoustic resonators.

Any of the embodiments described above can be implemented in association with mobile devices such as cellular handsets. The principles and advantages of the embodiments can be used for any systems or apparatus, such as any uplink cellular device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals having a frequency in a range from about 30 kHz to 300 GHz, such as a frequency in a range from about 450 MHz to 6 GHz.

Aspects of this disclosure can be implemented in various electronic devices. Examples of the electronic devices can include, but are not limited to, consumer electronic products, parts of the consumer electronic products such as die and/or acoustic wave filter assemblies and/or packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave device comprising:
a polycrystalline spinel layer;
a piezoelectric layer having a thickness than is less than $\lambda$, the acoustic wave device being configured to generate an acoustic wave having a wavelength of $\lambda$; and
an interdigital transducer electrode on the piezoelectric layer, the piezoelectric layer being disposed between the interdigital transducer electrode and the polycrystalline spinel layer.

2. The acoustic wave device of claim 1 further comprising a temperature compensating layer disposed between the polycrystalline spinel layer and the piezoelectric layer.

3. The acoustic wave device of claim 2 wherein the temperature compensating layer includes silicon dioxide.

4. The acoustic wave device of claim 2 further comprising a high impedance layer disposed between the temperature compensating layer and the polycrystalline spinel layer, the high impedance layer having a higher acoustic impedance than the polycrystalline spinel layer.

5. The acoustic wave device of claim 2 wherein the temperature compensating layer is in physical contact with the piezoelectric layer.

6. The acoustic wave device of claim 5 wherein the temperature compensating layer is in physical contact with the polycrystalline spinel layer opposite to the piezoelectric layer.

7. The acoustic wave device of claim 1 wherein the polycrystalline spinel layer is in physical contact with the piezoelectric layer.

8. The acoustic wave device of claim 1 wherein the piezoelectric layer is a lithium tantalate layer.

9. The acoustic wave device of claim 1 wherein the piezoelectric layer is a lithium niobate layer.

10. The acoustic wave device of claim 1 further comprising a substrate layer, the polycrystalline spinel layer being disposed between the substrate layer and the piezoelectric layer.

11. The acoustic wave device of claim 10 wherein the substrate layer is a silicon layer.

12. The acoustic wave device of claim 10 wherein the substrate layer is in physical contact with the polycrystalline spinel layer.

13. The acoustic wave device of claim 10 further comprising an adhesive layer attaching the substrate layer and the polycrystalline spinel layer.

14. The acoustic wave device of claim 1 wherein the acoustic wave device is a surface acoustic wave device, and the acoustic wave is a surface acoustic wave.

15. The acoustic wave device of claim 1 wherein the polycrystalline spinel layer includes spinel having a chemical formula of $MgAl_2O_4$.

16. A radio frequency module comprising:
an acoustic wave filter configured to filter a radio frequency signal, the acoustic wave filter including an acoustic wave device configured to generate an acoustic wave having a wave length of $\lambda$, the acoustic wave device including a piezoelectric layer having a thickness of less than $\lambda$, an interdigital transducer electrode on the piezoelectric layer, and a polycrystalline spinel layer arranged such that the piezoelectric layer is disposed between the polycrystalline spinel layer and the interdigital transducer electrode; and
a package enclosing the acoustic wave filter.

17. The radio frequency module of claim 16 further comprising a second acoustic wave filter, the acoustic wave filter and the second acoustic wave filter being included in a duplexer.

18. The radio frequency module of claim 16 further comprising a power amplifier enclosed within the package, the power amplifier configured to provide the radio frequency signal.

19. The radio frequency module of claim 16 wherein the acoustic wave filter is a surface acoustic wave filter and the piezoelectric layer is a lithium-based piezoelectric layer.

20. A wireless communication device comprising:
an antenna; and
an acoustic wave filter in communication with the antenna, the acoustic wave filter being configured to filter a radio frequency signal, the acoustic wave filter including an acoustic wave device configured to generate an acoustic wave having a wave length of $\lambda$, the acoustic wave device including a piezoelectric layer having a thickness of less than $\lambda$, an interdigital transducer electrode on the piezoelectric layer, and a polycrystalline spinel layer arranged such that the piezoelectric layer is disposed between the polycrystalline spinel layer and the interdigital transducer electrode.

21. The wireless communication device of claim 20 wherein the acoustic wave filter is a surface acoustic wave filter.

* * * * *